(12) United States Patent
Huang et al.

(10) Patent No.: US 8,248,153 B2
(45) Date of Patent: Aug. 21, 2012

(54) METHOD AND APPARATUS FOR FULL CLOCK CYCLE CHARGE PUMP OPERATION

(75) Inventors: Ming-Chieh Huang, San Jose, CA (US); Bing Wang, Milpitas, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 8 days.

(21) Appl. No.: 12/825,423

(22) Filed: Jun. 29, 2010

(65) Prior Publication Data

US 2011/0316617 A1    Dec. 29, 2011

(51) Int. Cl.
    G05F 1/10    (2006.01)
(52) U.S. Cl. .......................................... 327/536; 363/60
(58) Field of Classification Search .................. 327/536; 363/60
    See application file for complete search history.

(56) References Cited

U.S. PATENT DOCUMENTS

| | | | | |
|---|---|---|---|---|
| 5,396,114 A * | 3/1995 | Lee et al. | ........................ | 327/535 |
| 6,438,034 B1 * | 8/2002 | Tanzawa | .................. | 365/185.18 |
| 6,472,926 B2 * | 10/2002 | Taito et al. | ..................... | 327/536 |
| 6,597,603 B2 * | 7/2003 | Lambrache et al. | ..... | 365/185.18 |
| 6,667,662 B2 * | 12/2003 | Saito | .............................. | 331/1 A |
| 6,781,431 B2 * | 8/2004 | Taito et al. | ..................... | 327/291 |
| 6,784,723 B2 * | 8/2004 | Lee et al. | ....................... | 327/536 |
| 7,173,479 B2 * | 2/2007 | Suematsu | ..................... | 327/537 |
| 7,259,612 B2 * | 8/2007 | Saether | ......................... | 327/536 |
| 7,274,248 B2 * | 9/2007 | Okamoto | ....................... | 327/536 |
| 7,429,883 B2 * | 9/2008 | Do | ................................. | 327/264 |
| 7,545,684 B2 * | 6/2009 | Nakagawa et al. | ....... | 365/189.09 |
| 7,570,104 B2 | 8/2009 | Hsu | | |
| 7,944,278 B2 * | 5/2011 | Kim et al. | ..................... | 327/536 |
| 2002/0109540 A1 * | 8/2002 | Meng | ............................ | 327/536 |
| 2006/0061411 A1 * | 3/2006 | Hahn et al. | .................... | 327/536 |
| 2009/0231022 A1 * | 9/2009 | Kim et al. | ..................... | 327/536 |

* cited by examiner

*Primary Examiner* — Thomas J Hiltunen

(74) *Attorney, Agent, or Firm* — Duane Morris LLP (57) ABSTRACT

A charge pump comprises at least one charge pump cell and control logic. The at least one charge pump cell is configured to receive a power supply voltage and provide a pump output voltage higher than the power supply voltage. The control logic is configured to receive an oscillator signal and a level detector enable signal, provide at least one cell clock signal, based on the oscillator signal, to the at least one charge pump cell, control the at least one pump cell to charge while the level detector enable signal is asserted, and control the at least one pump cell to continue to charge after the level detector enable signal is deasserted and until a full pulse cycle of the oscillator signal is completed.

19 Claims, 11 Drawing Sheets

*FIG. 11D*  ENABLE

METHOD AND APPARATUS FOR FULL CLOCK CYCLE CHARGE PUMP OPERATION

BACKGROUND

Charge pumps are used in a variety of signal processing applications, e.g., for converting a DC voltage from one value to another. Charge pumps may be implemented in various ways. For example, one approach for doubling a voltage with a charge pump is to connect a voltage across a capacitor to charge the capacitor in a first stage. Then, using switching circuitry, the capacitor is disconnected from the original charging voltage and reconnected in a second stage, e.g., with its negative terminal coupled to the original positive charging voltage. Because the capacitor retains the previously stored voltage from the first stage, the effect in the second stage may be to double the voltage. In this manner, the voltage may be pumped up at each stage. Other approaches are available for fractionally multiplying or scaling voltage, for inverting voltages, and for multiplying voltages by various integer factors, for example.

Figure 1:
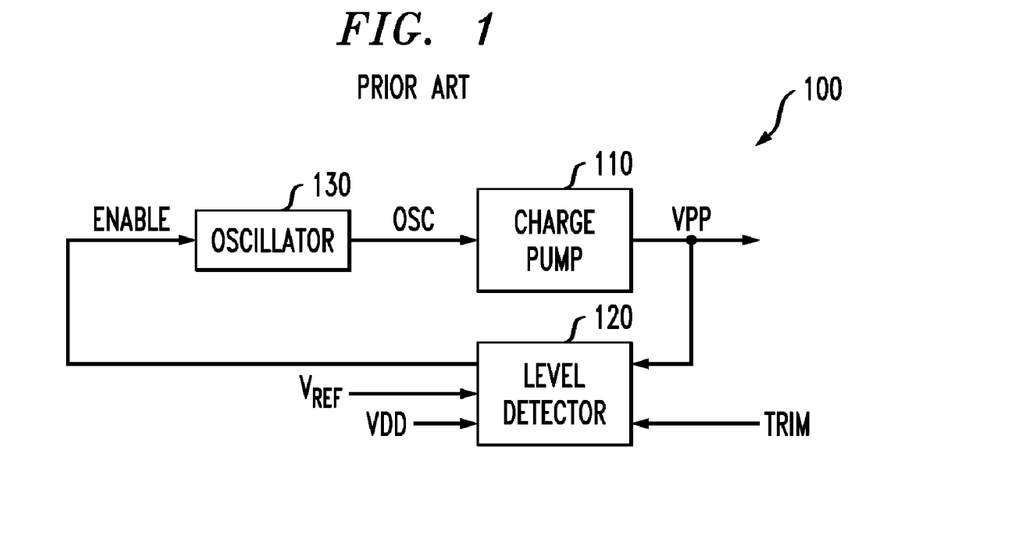
FIG. 1 is a block diagram of a known circuit having a charge pump.

One application of charge pumps is in the context of memory circuits, e.g., dynamic random access memory (DRAM). In memory circuits, a voltage is applied to a word line that is used to access a circuit component storing memory, e.g., as a bit. FIG. 1 is a block diagram of a known circuit 100 having a charge pump. In FIG. 1, a charge pump 110 provides a programmable voltage VPP. A level detector 120 monitors VPP and detects variation in VPP. A memory word line may consume energy and cause VPP to decrease, and charge pump 110 may charge to increase VPP. Level detector 120 also receives a reference voltage $V_{REF}$, a power supply voltage VDD, and an input signal TRIM that may be used to indicate a target value for VPP, e.g., relative to a power supply voltage VDD. For example, a target value for VPP may be VDD+0.55 volts. The particular implementation details of level detector 120 and how TRIM is provided may vary. Level detector 120 provides an output signal ENABLE that is received by an oscillator 130, which in turn provides a clock signal OSC to charge pump 110 to charge the charge pump.

Figure 2:
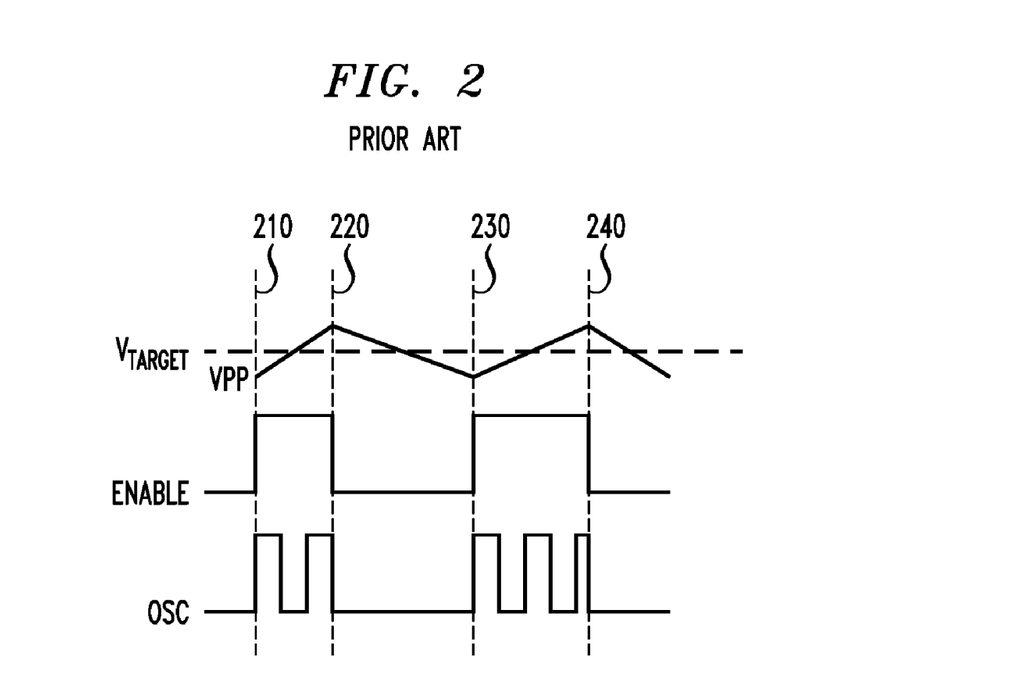
FIG. 2 is a signal trace diagram corresponding to the circuit of FIG. 1.

Referring to FIG. 2, the operation of known circuit 100 may be understood. The signal VPP provided by charge pump varies, e.g., increases as charge pump 110 charges and decreases at other times. Circuit 100 operates to maintain VPP near a target voltage $V_{TARGET}$. At time 210, level detector 120 detects that VPP is too low relative to $V_{TARGET}$ and sets ENABLE to logic high ('1'). ENABLE may be referred to as a level detector enable signal. As a result, oscillator 130 provides clock pulses OSC to charge pump 110 to cause the latter to charge, thereby increasing VPP. At time 220, level detector 120 detects that VPP has reached a high enough value relative to $V_{TARGET}$ and changes ENABLE to logic low ('0'). As a result, oscillator 130 stops sending clock pulses OSC to charge pump 110, causing the latter to stop charging, thereby causing VPP to decrease. At time 230, VPP is again too low, so ENABLE is asserted high by level detector 120, and clock pulses OSC are again provided to charge pump 110. In the example of FIG. 2, when ENABLE is cut off at time 240 (because level detector 120 determines that VPP is high enough to stop charging), a cycle of OSC is only partially completed. As used herein, a "cycle" or "pulse cycle" of OSC refers to a high cycle of a pulse OSC, i.e., the portion of a full duty cycle of a pulse that is at high ('ON') voltage. A "full" pulse cycle (or "fully completed" pulse or clock cycle), as opposed to a "partially completed" pulse cycle, refers to a pulse that is not terminated (transitioned to low voltage) prematurely, i.e., before a normal transition time, but rather is transitioned to low after a normal pulse width. Cutting off OSC before the end of the cycle is reached immediately turns off the charge pump, i.e., causes it to stop charging.

SUMMARY

In some embodiments, a charge pump has at least one charge pump cell and control logic. The at least one charge pump cell is configured to receive a power supply voltage and provide a pump output voltage higher than the power supply voltage. The control logic is configured to receive an oscillator signal and a level detector enable signal, provide at least one cell clock signal, based on the oscillator signal, to the at least one charge pump cell, control the at least one pump cell to charge while the level detector enable signal is asserted, and control the at least one pump cell to continue to charge after the level detector enable signal is deasserted and until a full pulse cycle of the oscillator signal is completed.

In some embodiments, a pump output voltage is monitored at a level detector. A level detector enable signal is provided, based on the pump output voltage, to a charge pump to maintain the pump output voltage within a predetermined voltage difference from a target voltage. An oscillator enable signal is sent to an oscillator while the level detector enable signal is asserted. Pulses of an oscillator signal are provided to the charge pump while the oscillator enable signal is asserted. The charge pump is charged while the pulses of the oscillator signal are provided.

In some embodiments, a system has a charge pump, a level detector, and an oscillator. The charge pump is configured to receive an oscillator signal and provide a pump output signal. The level detector is configured to monitor the pump output signal and provide a level detector enable signal to the charge pump. The oscillator is configured to provide an oscillator signal to the charge pump. The charge pump is further configured to charge based on the level detector enable signal and the oscillator signal.

BRIEF DESCRIPTION OF THE DRAWINGS

The following will be apparent from elements of the figures, which are provided for illustrative purposes and are not necessarily to scale.

DETAILED DESCRIPTION

This description of the exemplary embodiments is intended to be read in connection with the accompanying drawings, which are to be considered part of the entire written description.

Figure 3:
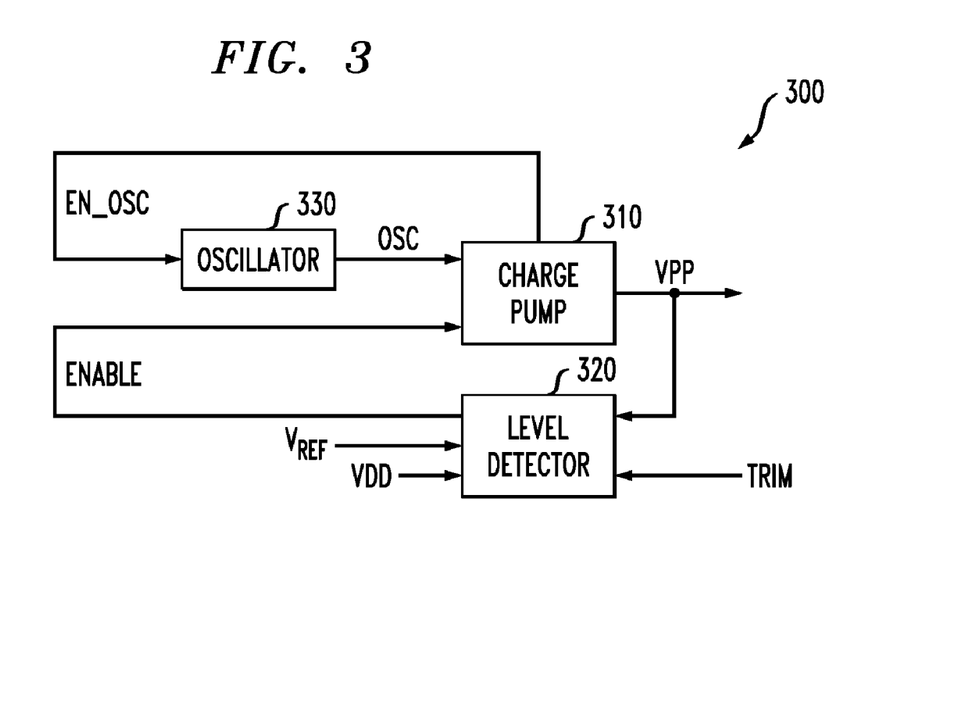
FIG. 3 is a block diagram of a circuit in accordance with an embodiment.

FIG. 3 is a block diagram of a circuit 300 in accordance with an embodiment. A charge pump 310 provides a voltage VPP. As in circuit 100, a level detector 320 monitors VPP and provides a signal ENABLE based on detected variation in VPP. However, unlike circuit 100, level detector 320 provides ENABLE to charge pump 310 directly rather than to an oscillator 330. Charge pump 310 is configured to provide a separate signal EN_OSC to oscillator 330, which provides a clock signal OSC to the charge pump to cause the latter to charge.

Figure 4:
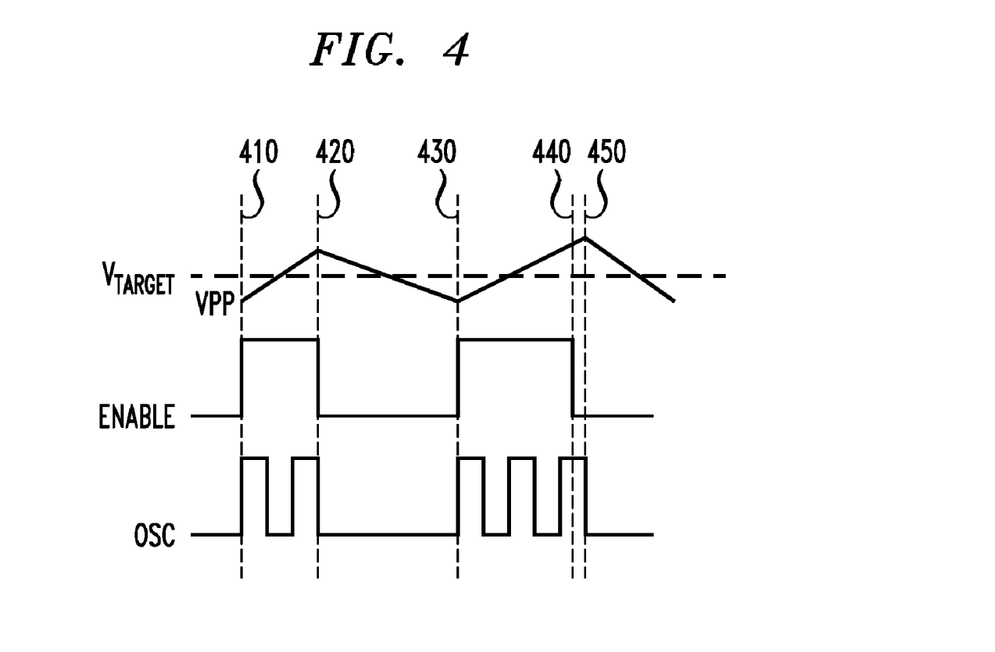
FIG. 4 is a signal trace diagram corresponding to the circuit of FIG. 3.

Referring to FIG. 4, the operation of circuit 300 may be understood. FIG. 4 is a representative signal diagram provided for illustrative purposes; FIGS. 10 and 12 show more precise signal values from simulation. VPP, ENABLE, and OSC exhibit similar functionality between times 410 and 420 (when VPP is charging) and between times 420 and 430 (when VPP is not charging) as in corresponding time intervals in FIG. 2. Thus, level detector 320 provides level detector enable signal ENABLE based on monitored signal VPP to maintain VPP within a predetermined voltage difference from $V_{TARGET}$, e.g., based on a trimmable voltage difference. Between times 430 and 440, level detector 320 asserts ENABLE; during this interval, pulses of clock signal OSC are provided to charge pump 310. At time 440, level detector 320 deasserts ENABLE, at which time OSC is only partially through a cycle. However, OSC does not transition low at time 440 (i.e., immediately upon a corresponding transition of ENABLE); rather, OSC completes a full cycle in FIG. 4. Charge pump 310 continues to charge VPP until the pulse cycle of OSC is completed, i.e., until time 450. Charge pump 310 may continue to charge until 450 because charge pump 310 exerts control over OSC (via signal EN_OSC provided to oscillator 330). In other words, charge pump 310 effectively buffers a received signal ENABLE and provides a separate signal (EN_OSC) to oscillator 330 to control oscillator operation, so that the oscillator may continue to provide pulses beyond a corresponding transition of ENABLE. Allowing OSC to provide a complete pulse up to time 450 reduces charge pump leakage by enabling the charge pump to complete its charging cycle at a clock edge. In other words, circuit 400 is more efficient because leakage is reduced.

Figure 5:
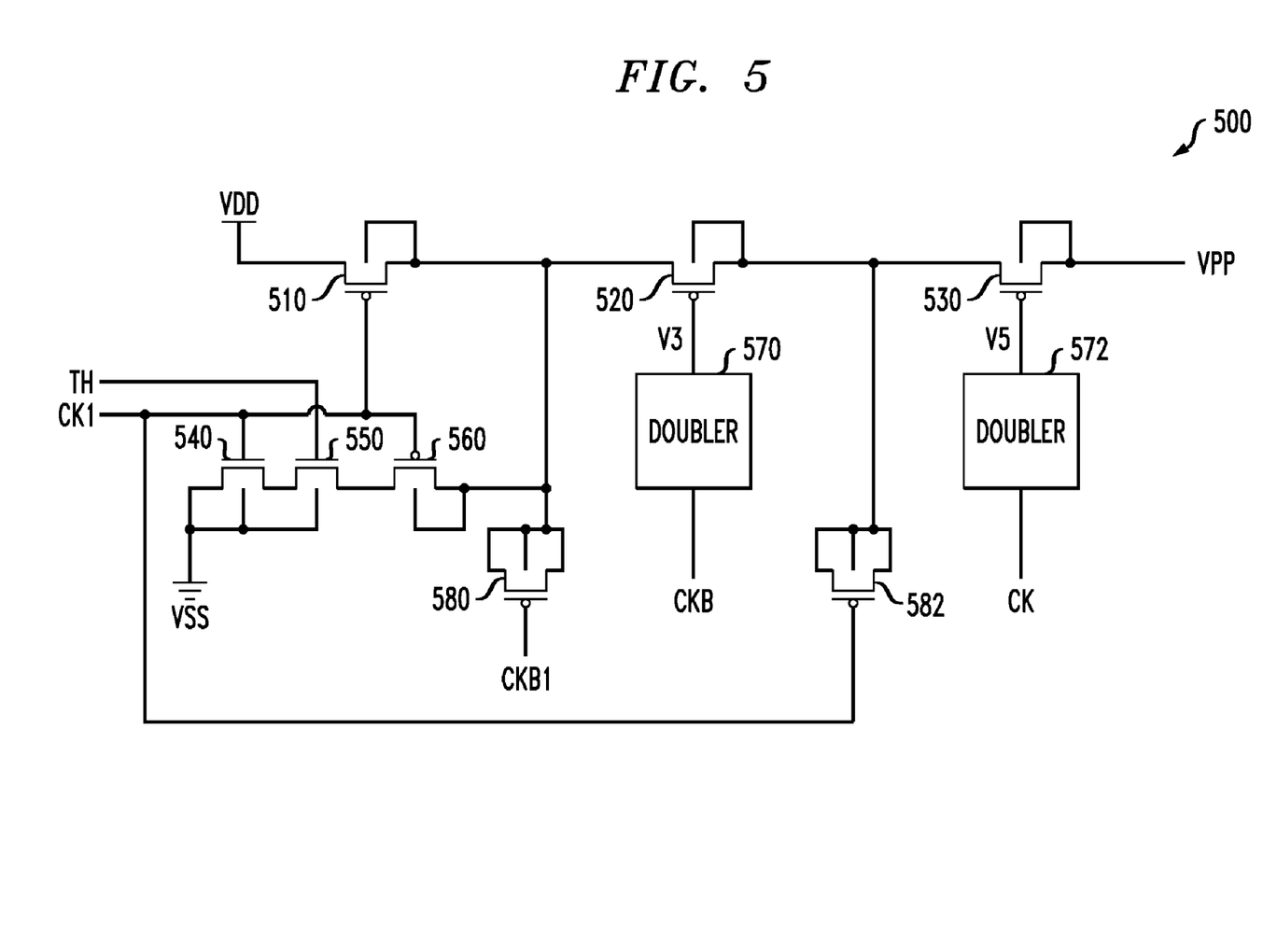
FIG. 5 is a circuit diagram of a charge pump cell in accordance with an embodiment.

FIG. 5 is a circuit diagram of a charge pump cell in accordance with an embodiment. A charge pump cell 500 includes a first stage switch 510, a second stage switch 520, and a third stage switch 530, each of which may be PMOS transistors. A source of PMOS transistor 510 is coupled to a power supply voltage VDD, and a drain of PMOS transistor 530 is coupled to VPP. NMOS transistors 540 and 550 and PMOS transistor 560 are provided as shown in FIG. 5. PMOS transistors 580 and 582 are used as a capacitor so that when clock signals CKB1 or CK1 switch from low to high, the other side of the capacitor is pushed (pumped) higher. A "tied-to-high" voltage TH is coupled to a gate of NMOS transistor 550. Clock signals CK, CK1, CKB, and CKB1 are provided to various components of charge pump cell 500; the origin of these signals is described further below in the context of FIGS. 6 and 7. CK1 is provided to respective gates of NMOS transistor 540 and PMOS transistors 560 and 582. CKB1 is provided to a gate of PMOS transistor 580. Charge pump cell has doubler circuits 570 and 572, which may be known double circuits available to one of ordinary skill in the art. Doubler circuits 570 and 572 are used to generate voltages at nodes V3 and V5, respectively, that are higher than the voltage VDD, because VPP is desired to be higher than VDD. Signal diagrams showing voltages V3 and V5 over time are provided in FIGS. 12A-B. Clock signals CK, CK1, CKB, and CKB1 have approximately the same phase or are 180° behind (or ahead) of one another, and in some embodiments, rising and falling edges of those clock signals are shaped to avoid the possibility of switches 510, 520, and 530 all being on between VPP and VDD, as shown in FIG. 12.

Figure 6:
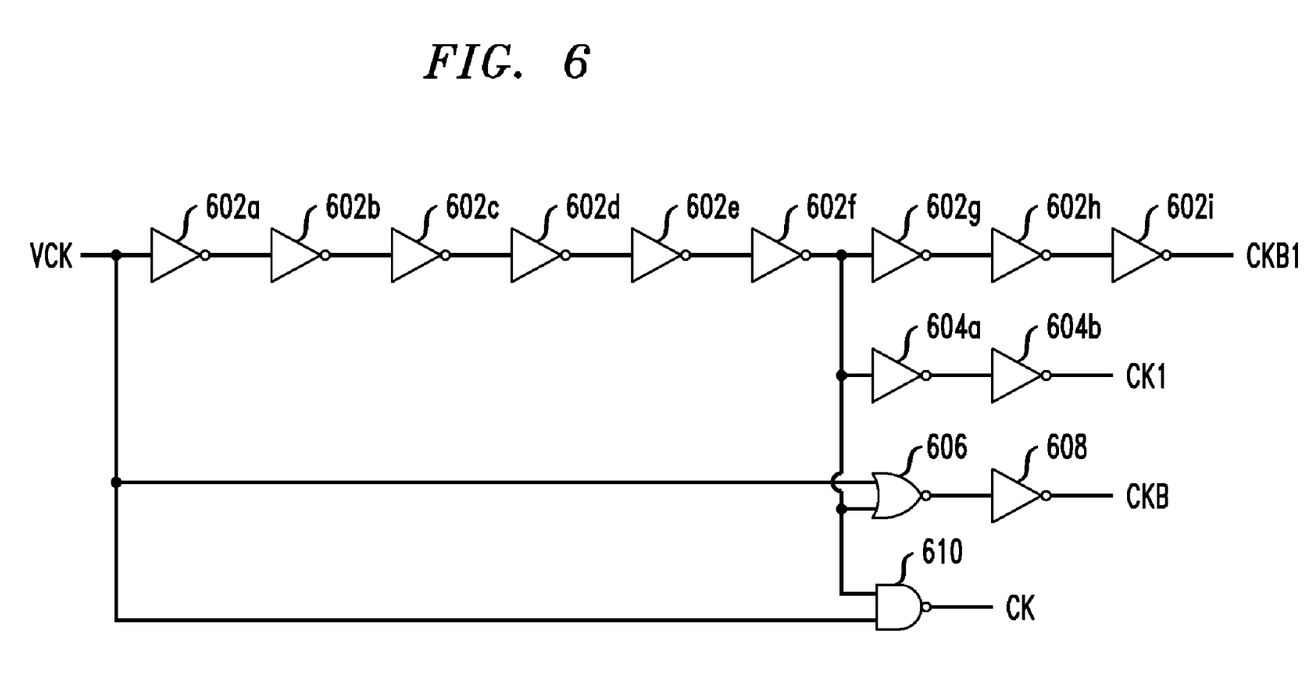
FIG. 6 is a circuit diagram showing various clock signals in accordance with an embodiment.
Figure 7:
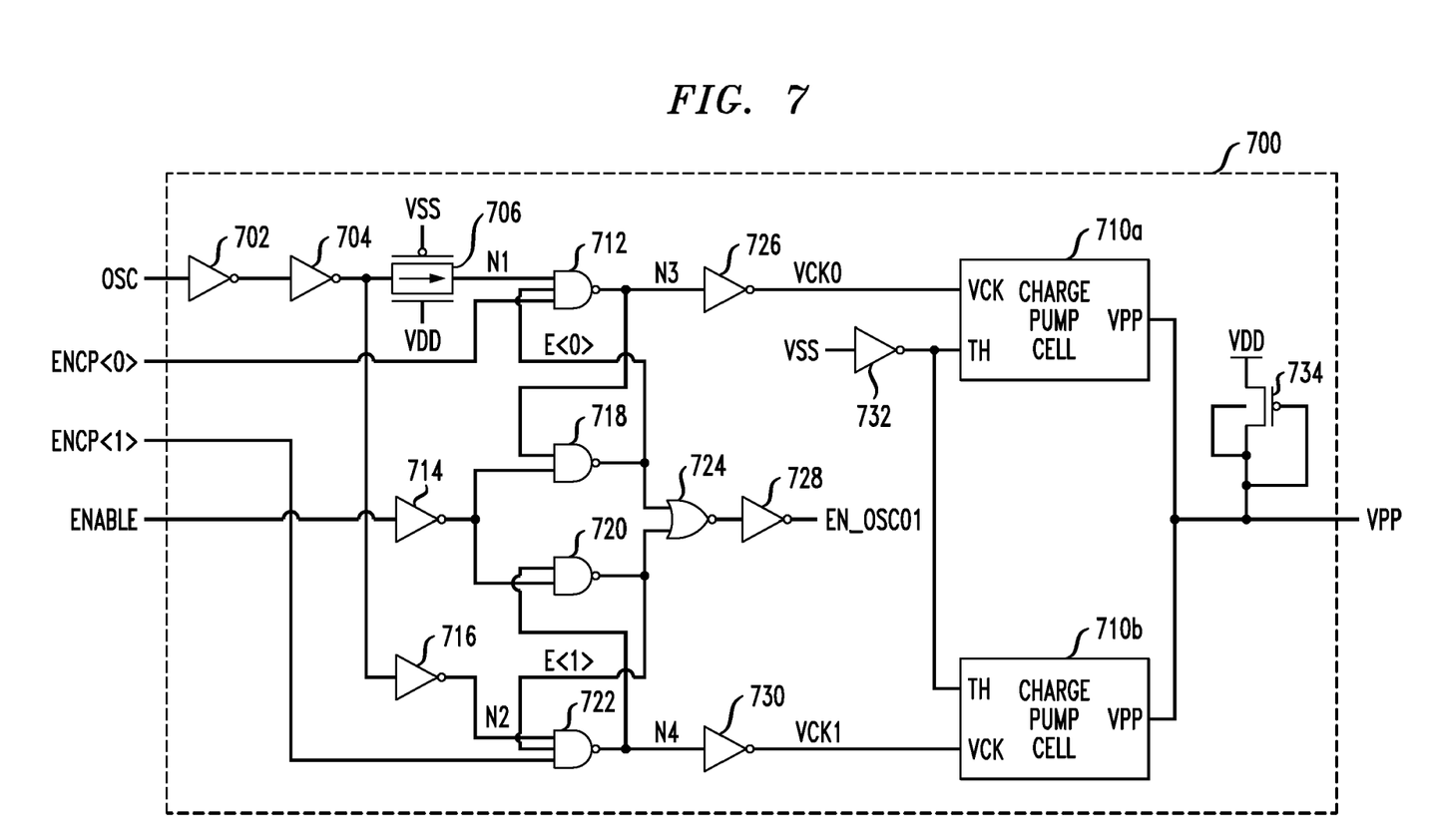
FIG. 7 is a circuit diagram of a dual charge pump structure in accordance with an embodiment.

FIG. 6 is a diagram of a circuit for generating various clock signals in accordance with an embodiment. A clock signal VCK is an input of a charge pump cell as shown further below in the context of FIG. 7. Clock signal CKB1 is provided by passing VCK through inverters 602a-i as shown in FIG. 7. Clock signal CK1 is provided by passing an output of inverter 602f through inverters 604a and 604b. Clock signal CKB is provided by coupling the output of inverter 602f to one input of a NOR gate 606, coupling VCK to another input of the NOR gate, and providing an output of the NOR gate to an inverter 608. Clock signal CK is an output of a NAND gate having the output of inverter 602f as one input and VCK as another input.

FIG. 7 is a circuit diagram of a dual charge pump structure in accordance with an embodiment. A dual charge pump 700 includes charge pump cells 710a and 710b, each of which may be charge pump cells like charge pump cell 500. Although two charge pump cells are shown in this example, other numbers, e.g., 1, 4, or 8, are possible as well. Dual charge pump 700 may generally be conceptualized as charge pump 310 of FIG. 3, although additional circuit components from FIG. 8, such as those providing signal EN_OSC, may be understood to fall within the purview of charge pump 310, as is understood by one of ordinary skill in the art and as is described further below. In other words, for illustrative convenience, components of a structure equivalent in functionality to charge pump 310 are drawn out over FIGS. 7 and 8. In FIG. 7, dual charge pump 700 has as its inputs OSC, ENCP<0>, ENCP<1> (i.e., a two-bit charge pump enable signal, or, equivalently, two one-bit signals), and ENABLE (the same signal as shown in FIG. 3) and has an output VPP. ENCP<0> and ENCP<1> are described further below in the context of FIG. 8.

Logic circuitry shown in FIG. 7 enables charge pump 310 to continue charging until an end of a pulse is normally reached as in FIG. 4, thereby promoting increased efficiency by reducing or eliminating leakage associated with premature charge pump cutoff. Premature charge pump cutoff is a problem for the following reasons. Premature charge pump cutoff causes the doubler output voltage to be lower than expected and therefore prevents fully turning off the PMOS switches between VDD and VPP. Thus, if there is a path from VPP to VDD, then VPP decreases rapidly. Clock signal OSC is passed through inverters 702 and 704 and transmission gate 706, which may be configured as a delay element (buffer). A node N1 couples transmission gate 706 to a NAND gate 712. ENCP<0> is provided as another input to NAND gate 712. NAND gates 712 and 718 are cross-coupled, with an output of NAND gate 713 that is provided at node N3 coupled to an input of NAND gate 718 and an output E<0> of NAND gate 718 provided as an input to NAND gate 712. NAND gate 718 also receives an inverted version of ENABLE via inverter 714, which also feeds into NAND gate 720. An output of inverter 704 is inverted at inverter 716 and provided as a first input N2 to NAND gate 722. ENCP<1> is a second input to NAND gate 722. NAND gates 720 and 722 are cross-coupled, with an output E<1> of NAND gate 720 provided as an input to NAND gate 722, and an output N4 of NAND gate 722 provided as an input to NAND gate 720. Outputs of NAND gates 718 and 720 are provided as inputs to NOR gate 724, an output of which is inverted at inverter 728 to provide a signal EN_OSC01 that is described further below in the context of FIG. 8. An output N3 of NAND gate 712 is inverted at inverter 726 to provide a signal VCK0 that feeds into a VCK input of charge pump cell 710a. VCK0 may be referred to as a cell clock signal. An output N4 of NAND gate 722 is inverted at inverter 730 to provide a signal VCK1 that feeds into a VCK input of charge pump cell 710b. VSS is inverted to provide a tied-high input TH for charge pump cells 710a-b. Outputs of charge pump cells 710 and 710b are coupled together to provide the programmable voltage signal VPP. A PMOS transistor 734 has a source coupled to VDD and a drain and gate both coupled to VPP. Before dual charge pump 700 starts to work, suppose VPP is at zero voltage. Then, PMOS transistor 734 will pull VPP up to VDD−$V_T$, or about 1.0 V−0.5 V=0.5 V, where $V_T$ is a threshold voltage. Thus, PMOS transistor 734 facilitates pumping to a higher voltage because pumping may start from a positive (rather than zero) voltage.

Figure 8:
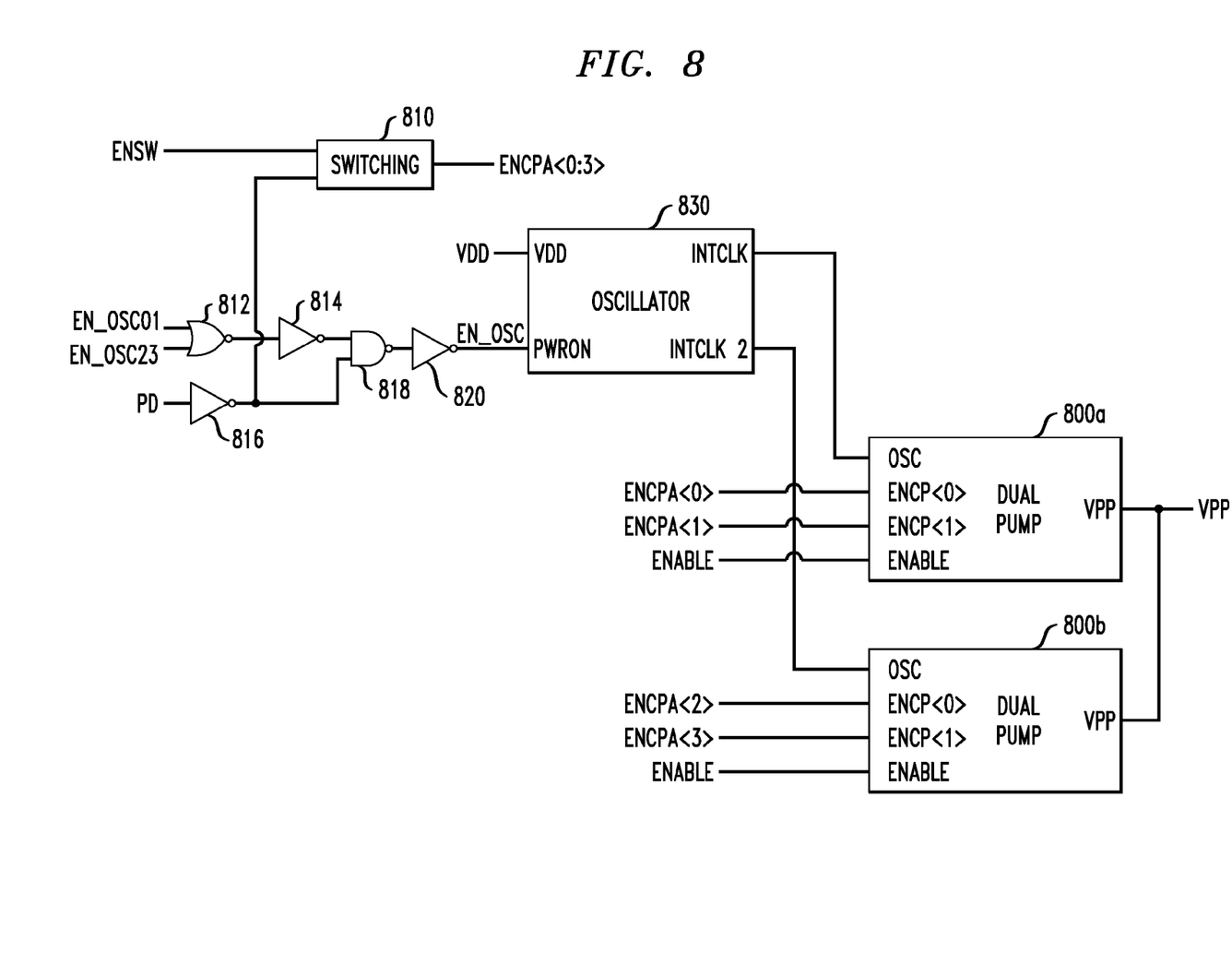
FIG. 8 is a circuit diagram of circuitry provided to an oscillator and dual charge pumps in accordance with an embodiment.

FIG. 8 is a circuit diagram of circuitry provided to an oscillator and dual charge pumps in accordance with an embodiment. In the example of FIG. 8, dual pumps 800a and 800b may each be dual pumps like dual charge pump 700. Thus, this example includes four charge pump cells (two in each dual pump), although different number of pump cells may be used in various embodiments. In FIG. 8, signals EN_OSC01 and EN_OSC23 are provided as inputs to a NOR gate 812; EN_OSC01 is the output of inverter 728 of FIG. 7, e.g., corresponding dual pump 800a, and EN_OSC23 is a corresponding signal for dual pump 800b. An output of NOR gate 812 is inverted at inverter 814 and combined at a NOR gate 818 with an inverted power down (PD) signal that is provided by an inverter 816. As is known to one of ordinary skill in the art, for silicon testing, certain blocks may be powered down using a power down signal. As shown in FIG. 8, PD_VPP is used to power down a VPP pump. In a VPP power down mode, PD is high (logic '1'), EN_OSC is low (logic '0'), and the oscillator is disabled. In the power down mode, ENABLE is 0 regardless of the VPP voltage level to disable dual pumps; such logic circuitry is not shown in FIG. 8 but is known to one of ordinary skill in the art. An output of NAND gate 818 is inverted 820 to provide EN_OSC to oscillator 830, which may be oscillator 330 of FIG. 3.

A switching enable signal ENSC is provided to a switching control block 810, which is implemented using known techniques to provide a four-bit signal ENCPA<0:3> to control the four charge pump cells in this example, with ENCPA<0:1> provided to dual pump 800a and ENCPA<2:3> provided to dual pump 800b. Switching control block 810 is a 2 bit to 4 bit decode block with an enable signal, known to one of ordinary skill in the art. Oscillator 830 provides clock signals INTCLK and INTCLK2 as OSC inputs to dual pumps 800a and 800b, respectively; the details of how oscillator 830 provides these signals are described below in the context of FIG. 9. Oscillator 830 provides two clock signals in this example because there are four charge pump cells, and in this example charging continues until OSC inputs to all four charge pump cells finish a pulse cycle. In some embodiments, charging continues until less than all pump cells (e.g., one, two, or three pump cells as in this example) finish their OSC pulse cycles. Suitable modifications may be made, as known to one of ordinary skill in the art, to control logic circuitry in various embodiments to support such charging until fewer than all OSC inputs have finished a pulse cycle.

Figure 9:
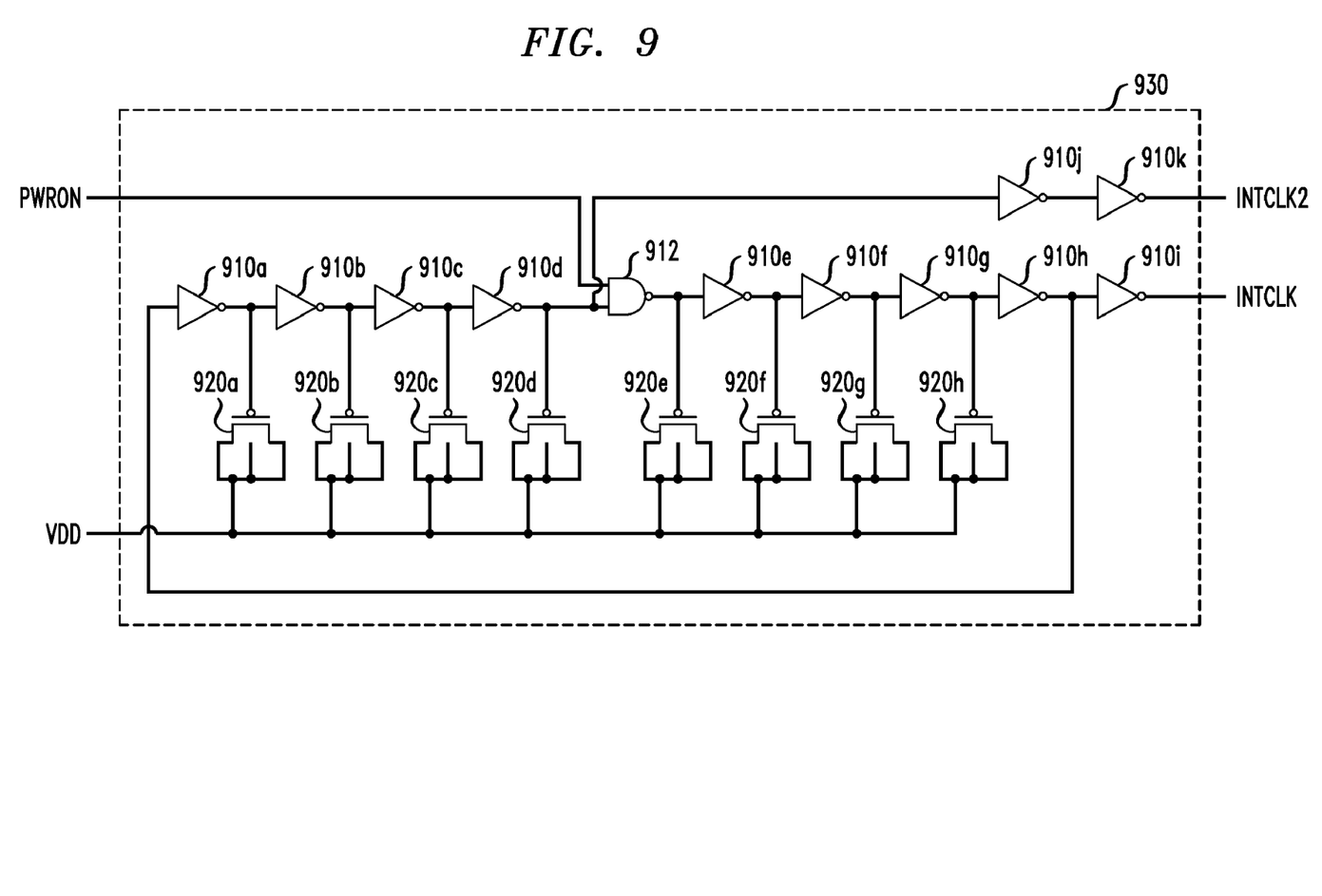
FIG. 9 is a circuit diagram of an oscillator in accordance with an embodiment.

FIG. 9 is a circuit diagram of an oscillator in accordance with an embodiment. An oscillator 930 in FIG. 9 may provide the oscillator 830 in the circuit of FIG. 8. Oscillator 930 receives an input PWRON that is provided to a NAND gate 912. Another input to NAND gate 912 is provided as feedback via inverters 910a, 910b, 910c, and 910d as described below. An output of NAND gate 912 is passed through a inverters 910e, 910f, 910g, 910h, and 910i to provide clock signal INTCLK. The output of inverter 910d is passed through inverters 910j and 910k to provide clock signal INTCLK2. Oscillator 930 has PMOS transistors 920a-h as shown in FIG. 9 to serve as capacitors to add loading to the inverters. The clock speed is slowed down to an appropriate frequency by adding these capacitors. Each of the PMOS transistors 920a-h has source and drain terminals coupled to VDD. Inverters 910a-h may be referred to as ring inverters because they are arranged in a ring configuration. NAND gate 912 is provided between ring inverters 910d and 910e. An output of a fourth inverter in the ring following the NAND gate 912, i.e., an output of inverter 910h, is provided as an input to inverter 910a. The output of inverter 910h is also provided to an inverter 910i to yield a first oscillator signal INTCLK. The output of inverter 910d is provided to a pair of inverters 910j and 910k to yield a second oscillator signal INTCLK2. Oscillator signals INTCLK and INTCLK2 may be provided as oscillator signals (OSC inputs) to respective dual pumps 800a and 800b as shown in FIG. 8.

Figure 10A:
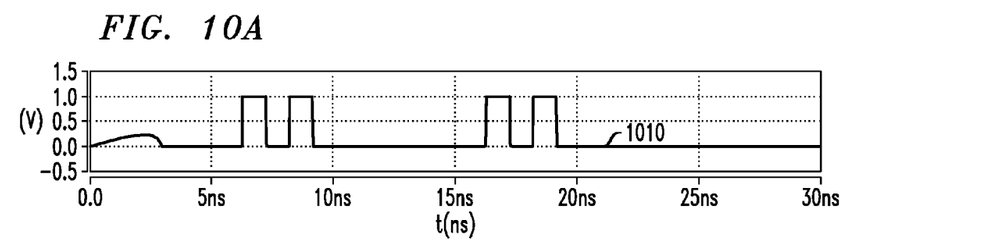
FIGS. 10A-E are timing diagrams showing various signals in accordance with an embodiment.
Figure 10B:
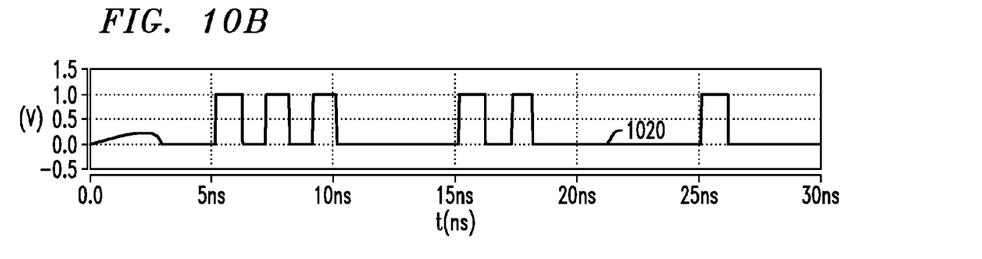
Figure 10C:
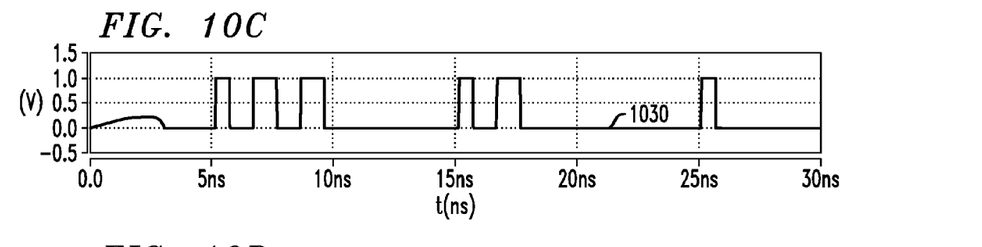
Figure 10D:
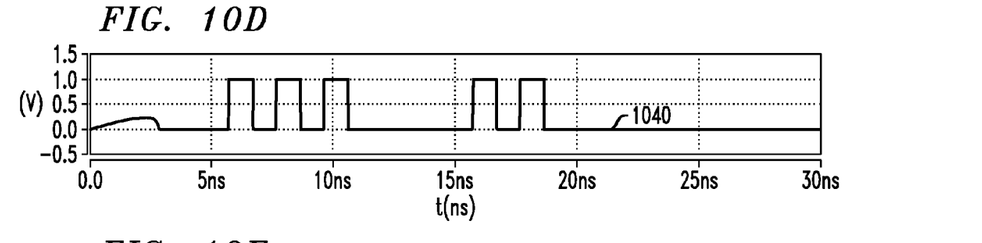
Figure 10E:
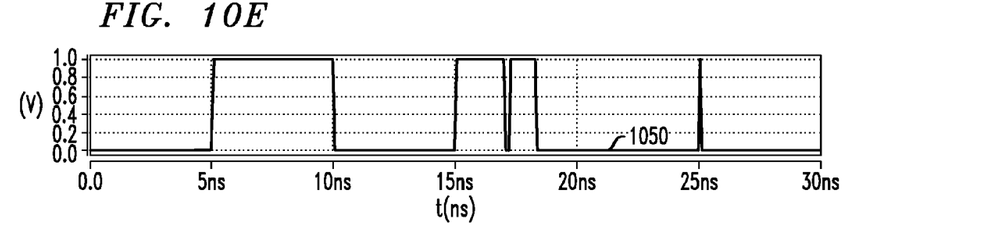

FIGS. 10A-E are timing diagrams showing various signals in accordance with an embodiment, as observed in a simulation. Signal 1050 is ENABLE as in FIG. 4. Signals 1020, 1020, 1030, and 1040 are clock signals provided to various charge pump cells (four charge pump cells in this example). For example, signals 1040 and 1030 may be signals VCK0 and VCK1 provided to charge pump cells 710a and 710b, respectively, as shown in FIG. 7 (and corresponding to a first dual pump 800a as in FIG. 8); signals 1020 and 1010 may be similar signals provided to corresponding charge pump cells of a second dual pump 800b. FIGS. 10A-E show that a charge pump may continue charging to complete a pulse cycle after ENABLE transitions from high to low. For example, at about 10 ns in FIG. 10E, ENABLE transitions low, but signal VCK0 in FIG. 10D is allowed to complete its normal pulse cycle and is not cut off partially through a cycle.

Figure 11A:
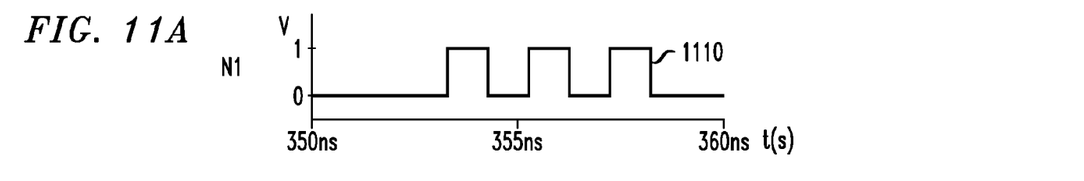
FIGS. 11A-G are signal trace diagrams for various signals in accordance with an embodiment.
Figure 11B:
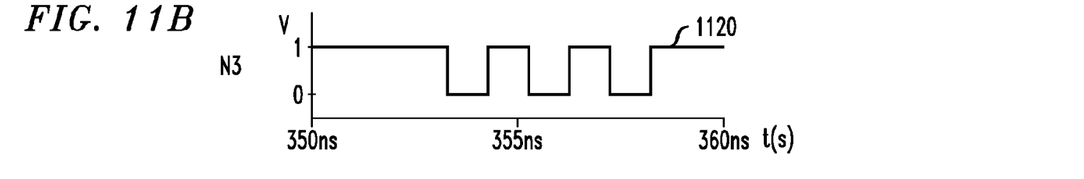
Figure 11C:
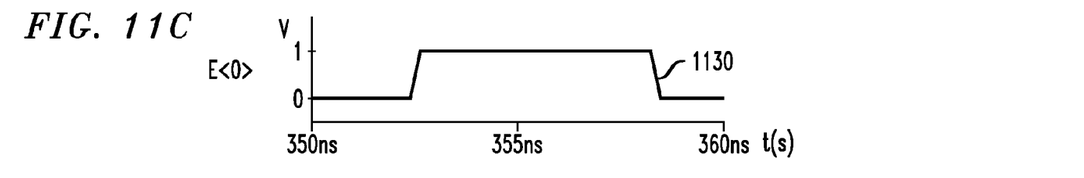
Figure 11D:
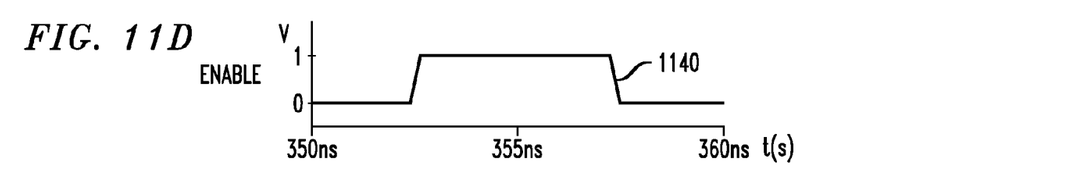
Figure 11E:
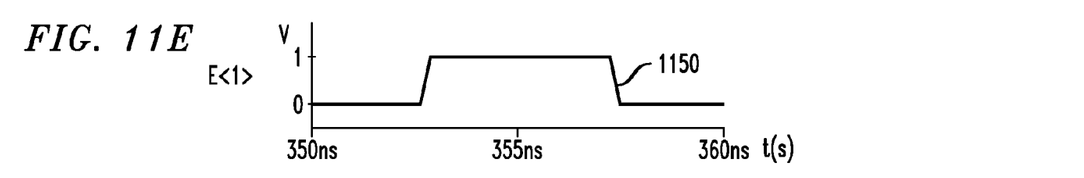
Figure 11F:
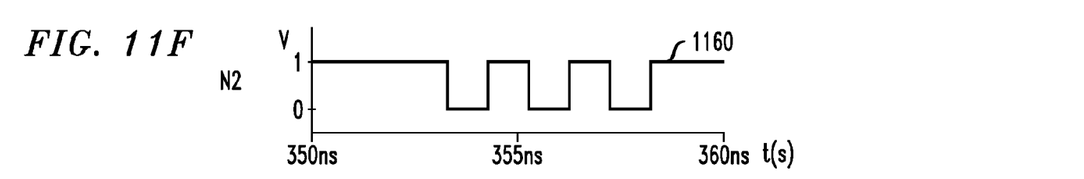
Figure 11G:
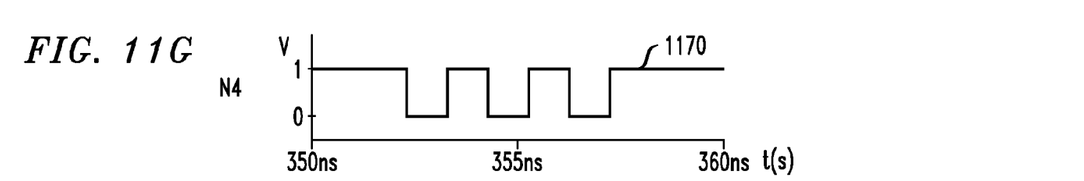

FIGS. 11A-G are signal trace diagrams for various signals in accordance with an embodiment. FIG. 11B shows that signal 1130 corresponding to node E<0> of FIG. 7 is low (zero voltage) when signal 1120 in FIG. 11B corresponding to node N3 of FIG. 7 is high and signal 1140 in FIG. 11D corresponding to signal ENABLE is low. When N3 is high, signal VCK0 (as in FIGS. 7, 10D) is low. Similarly, signal 1150 in FIG. 11E corresponding to node E<1> of FIG. 7 is low when signal 1170 in FIG. 11G corresponding to node N4 of FIG. 7 is high and ENABLE is low. When N4 is high, signal VCK1 (as in FIGS. 7, 10C) is low.

Figure 12A:
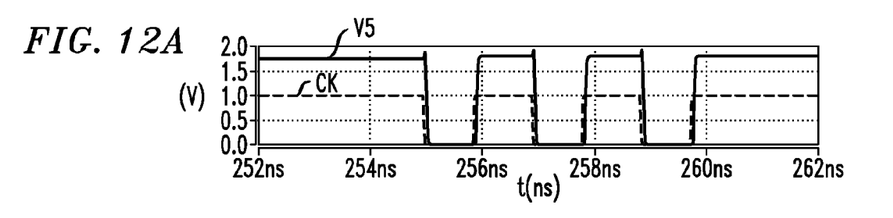
FIGS. 12A-G are signal trace diagrams for various signals in accordance with an embodiment.
Figure 12B:
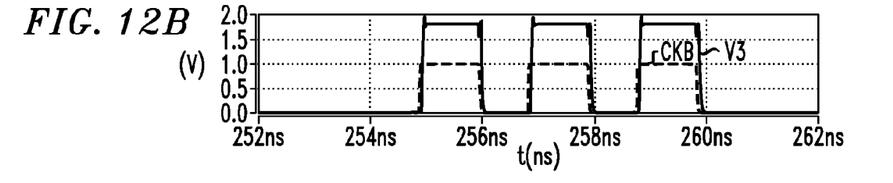
Figure 12C:
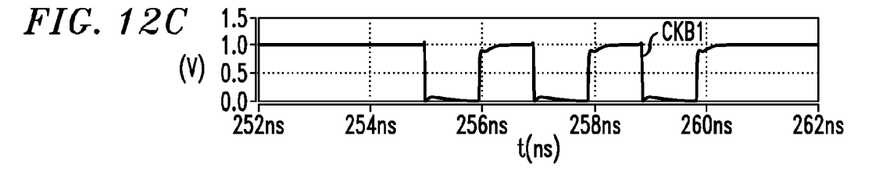
Figure 12D:
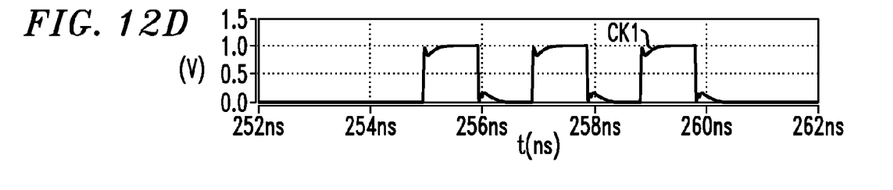
Figure 12E:
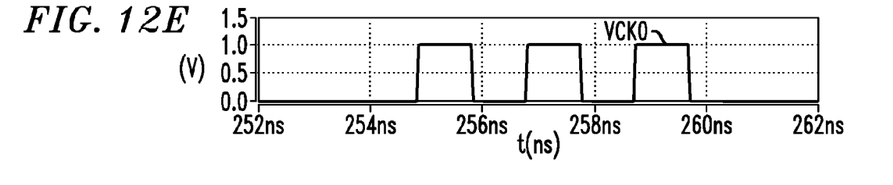
Figure 12F:
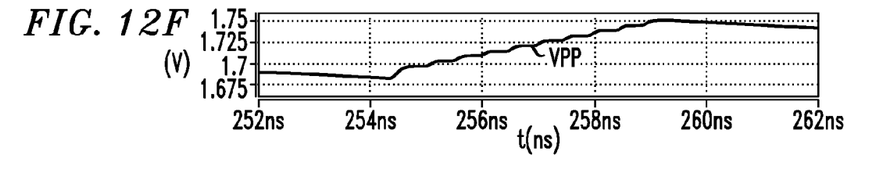
Figure 12G:
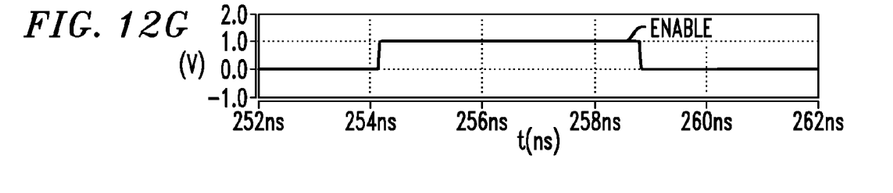

FIGS. 12A-G are signal trace diagrams for various signals in accordance with an embodiment. FIG. 12F shows that VPP increases (charges) beyond a high-to-low transition of signal ENABLE in FIG. 12G as charging is allowed to continue until the end of a clock pulse cycle.

Figure 13:
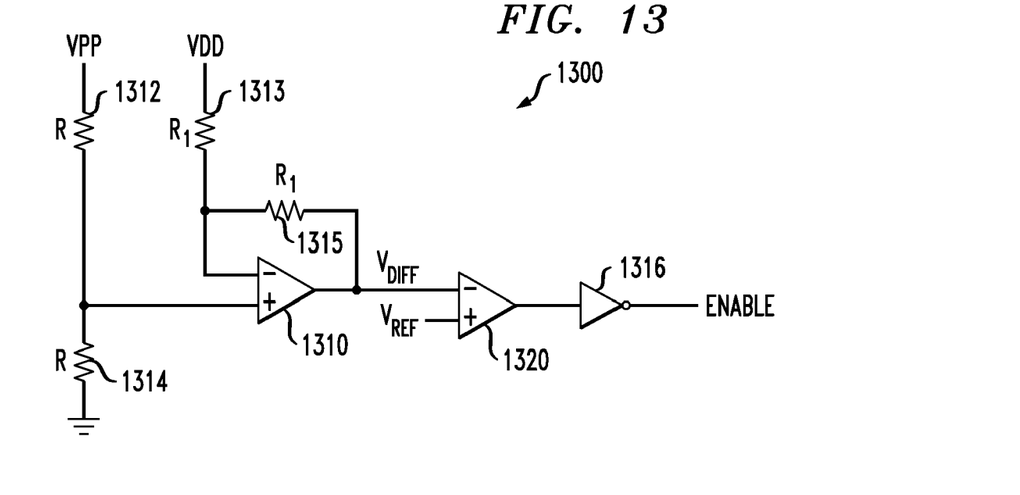
FIG. 13 is a circuit diagram of a level detector that may be used with a charge pump in accordance with an embodiment.

FIG. 13 is a circuit diagram of a level detector 1300 that may be used with a charge pump in accordance with an embodiment. Level detector 1300 has operational amplifiers 1310 and 1320, which may be two-stage high gain amplifiers. Resistors 1312 and 1313 are coupled to VPP and VDD nodes, respectively. Resistor 1314 is coupled to ground (e.g., VSS). Resistor 1315 is configured to form negative feedback to amplifier 1310. Resistances R and R1 of resistors 1312 and 1313, respectively are chosen to reduce power consumption with reasonable system response time. In an ideal case, the two inputs to amplifier 1310 are identical and equal to VPP/2, and the output of amplifier 1310 is $V_{DIFF}$=VPP_VDD. $V_{DIFF}$ is provided as an input to amplifier 1320 for comparison with $V_{REF}$, which may be a trimmable voltage (e.g., based on signal TRIM of FIG. 3) from a level control block known to one of ordinary skill in the art. In some embodiments, $V_{DIFF}$ may be a value between 0.55 V and 0.85 V. TRIM<0:2> (a three bit signal) is used to determined $V_{REF}$; 8 combinations of TRIM<0:2> result in 8 values of $V_{REF}$, and the 8 values of $V_{REF}$ result in 8 values of VPP ranging from 0.5 V to 0.85 V in some embodiments. An output of amplifier 1320 is a disable signal, which may inverted at inverter 1316 to provide ENABLE to enable charge pump 310 as in FIG. 3.

Figure 14:
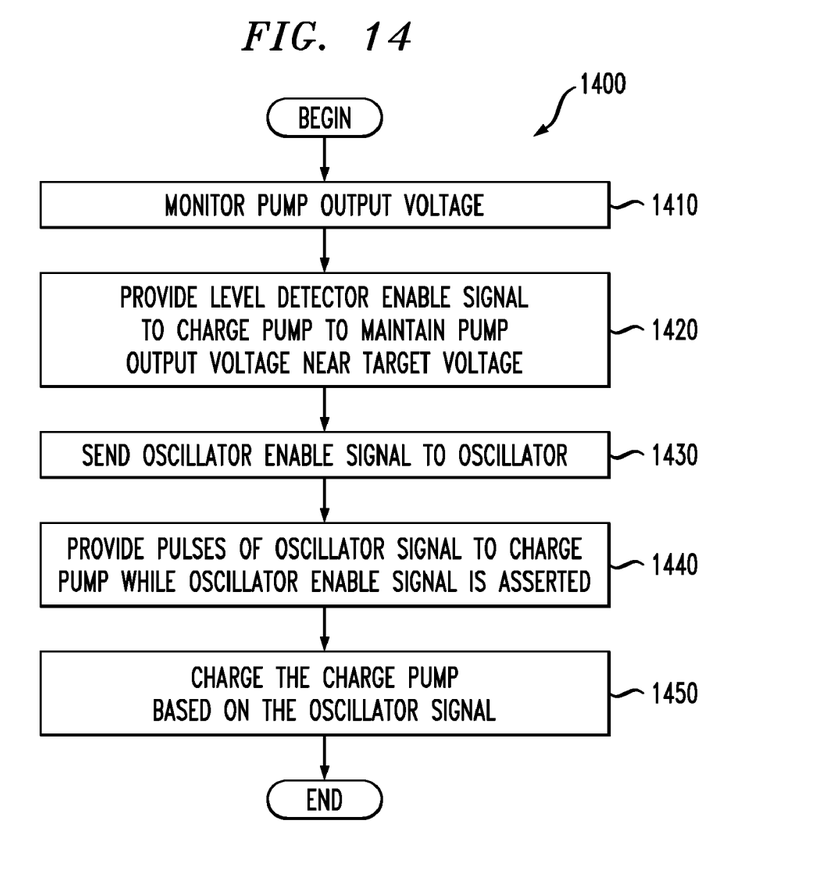
FIG. 14 is a flow diagram in accordance with an embodiment.

FIG. 14 is a flow diagram in accordance with an embodiment. After process 1400 begins, at step 1410, a pump output voltage is monitored at a level detector. At step 1420, a level detector enable signal based on the pump output voltage is provided to a charge pump to maintain the pump output voltage near a target voltage. At step 1430, an oscillator enable signal is sent to an oscillator while the level detector enable signal is asserted. At step 1440, pulses of an oscillator signal are provided to the charge pump while the oscillator enable signal is asserted. At step 1450, the charge pump is charged while the pulses of the oscillator signal are provided.

Various embodiments may be used in memory systems and system-on-Chip (SoC) designs. For example, some embodiments may be used in embedded DRAM (eDRAM) circuits. A voltage VPP as in various embodiments may be applied to word lines in memory circuits, e.g., to turn off memory cells.

Although examples are illustrated and described herein, embodiments are nevertheless not limited to the details shown, since various modifications and structural changes may be made therein by those of ordinary skill within the scope and range of equivalents of the claims.

What is claimed is:
1. A charge pump comprising:
at least one charge pump cell configured to:
   receive a power supply voltage, and
   provide a pump output voltage higher than the power supply voltage; and
control logic configured to:
   receive an oscillator signal from an oscillator,
   receive a level detector enable signal,
   provide at least one cell clock signal, based on the oscillator signal, to the at least one charge pump cell,
   control the at least one pump cell to charge while the level detector enable signal is asserted, and
   control the at least one pump cell to continue to charge after the level detector enable signal is deasserted and until a full pulse cycle of the oscillator signal is completed.
2. The charge pump of claim 1 wherein the control logic is further configured to:
   receive at least one charge pump enable signal to enable a corresponding charge pump cell,
   provide the at least one cell clock signal based on the oscillator signal and the at least one charge pump enable signal, and
   provide an oscillator enable signal to an oscillator to enable pulses of the oscillator signal to be received after deassertion of the level detector enable signal.
3. The charge pump of claim 1 wherein the at least one charge pump cell comprises a plurality of charge pump cells, each having a respective cell clock signal.
4. The charge pump of claim 3 wherein the control logic is configured to control the charge pump cells to continue to charge until a full pulse cycle is completed for each of the respective cell clock signals.
5. The charge pump of claim 3 wherein the control logic is configured to control the charge pump cells to continue to charge until a full pulse cycle is completed for a predetermined number of charge pump cells fewer than a total number of the charge pump cells.
6. The charge pump of claim 1 wherein the control logic comprises first and second cross-coupled logic gates and the at least one cell clock signal is based on an output of the first logic gate.
7. The charge pump of claim 6 wherein the control logic is further configured to provide an oscillator enable signal, based on an output of the second logic gate, to an oscillator to enable pulses of the oscillator signal to be received after deassertion of the detector enable signal.
8. The charge pump of claim 6 wherein the logic gates are NAND gates.
9. The charge pump of claim 1, wherein the control logic is external to the oscillator.
10. A method comprising:
monitoring a pump output voltage at a level detector;
providing a level detector enable signal, based on the pump output voltage, to a charge pump to maintain the pump output voltage within a predetermined interval around a target voltage;
sending an oscillator enable signal to an oscillator while the level detector enable signal is asserted;
providing pulses of an oscillator signal to the charge pump while the oscillator enable signal is asserted, after deassertion of the level detector enable signal and until a full pulse cycle is completed; and
charging the charge pump while the pulses of the oscillator signal are provided.
11. The method of claim 10, additionally including:
transforming the oscillator signal to a plurality of cell clock signals; and
providing the cell clock signals to corresponding ones of a plurality of charge pump cells in the charge pump to charge the charge pump.
12. The method of claim 11, wherein charging the charge pump includes charging the charge pump until a full pulse cycle is completed for each of the cell clock signals.
13. The method of claim 11, wherein charging the charge pump includes charging the charge pump until a full pulse cycle is completed for a predetermined number of charge pump cells fewer than a total number of the charge pump cells.
14. A system comprising:
a charge pump configured to receive an oscillator signal and provide a pump output signal;
a level detector configured to monitor the pump output signal and provide a level detector enable signal to the charge pump, wherein the level detector is configured to transition the level detector enable signal from low to high when the pump output signal has a first voltage value and transition the level detector enable signal from high to low when the pump output signal has a second voltage value; and an oscillator configured to provide the oscillator signal to the charge pump;

wherein the charge pump is further configured to:
charge based on the level detector enable signal and the oscillator signal, and
provide an oscillator enable signal to the oscillator to enable the oscillator to provide pulses of the oscillator signal to the charge pump after deassertion of the level detector enable signal.

15. The system of claim 14, wherein the oscillator comprises:
a NAND gate having a first input coupled to the oscillator enable signal;
a plurality of ring inverters configured in a ring, one of the ring inverters having an input coupled to an output of the NAND gate, another of the ring inverters having an output coupled to a second input of the NAND gate, and
an output inverter having an input coupled to an output of a fourth inverter in the ring following the NAND gate;
wherein the oscillator signal is provided at the output of the output inverter.

16. The system of claim 14, wherein the oscillator comprises:
a NAND gate having a first input coupled to the oscillator enable signal;
a plurality of ring inverters configured in a ring, one of the ring inverters having an input coupled to an output of the NAND gate, another of the ring inverters having an output coupled to a second input of the NAND gate, and
a pair of output inverters coupled to the second input of the NAND gate;
wherein the oscillator signal is provided at the output of the pair of output inverters.

17. The system of claim 14, wherein the charge pump comprises a plurality of charge pump cells, and the charge pump is configured to convert the oscillator signal to a plurality of cell clock signals to be provided to corresponding charge pump cells.

18. The system of claim 17, wherein the charge pump is configured to charge until a full pulse cycle is completed for each of the cell clock signals.

19. The system of claim 17, wherein charge pump is configured to charge until a full pulse cycle is completed for a predetermined number of charge pump cells fewer than a total number of the charge pump cells.

* * * * *